(12) United States Patent
Chen et al.

(10) Patent No.: US 6,170,496 B1
(45) Date of Patent: Jan. 9, 2001

(54) APPARATUS AND METHOD FOR SERVICING A WAFER PLATFORM

(75) Inventors: Jia Rong Chen, Shung; Long Hoang Peng, Hsinchu, both of (TW)

(73) Assignee: Taiwan Semiconductor Manufacturing Co., Ltd., Hsin Chu (TW)

(*) Notice: Under 35 U.S.C. 154(b), the term of this patent shall be extended for 0 days.

(21) Appl. No.: 09/140,037

(22) Filed: Aug. 26, 1998

(51) Int. Cl.[7] ............................. B08B 5/00; B08B 7/00; B08B 7/04
(52) U.S. Cl. ............... 134/102.1; 134/99.1; 134/94.1; 134/21; 134/22.11; 134/22.12; 134/902
(58) Field of Search ................... 156/345; 134/94.1, 134/95.1, 98.1, 99.1, 100.1, 102.1, 102.2, 26, 30, 42, 902, 22.1, 22.11, 22.12, 21; 118/723 T; 315/111.21; 15/300.1, 303, 312.1, 312.2, 354, 405; 34/431, 444, 487, 611

(56) References Cited

U.S. PATENT DOCUMENTS 5,376,213 * 12/1994 Ueda et al. .
5,647,945 * 7/1997 Matsuse et al. .
5,683,537 * 11/1997 Ishii .
5,695,831 * 12/1997 Miyazaki .

* cited by examiner

*Primary Examiner*—Alexander Markoff
(74) *Attorney, Agent, or Firm*—Tung & Associates

(57) ABSTRACT

An apparatus for servicing a wafer chuck such as an electrostatic chuck that is equipped with vent holes for cooling the backside of a wafer positioned on the chuck and for clearing the vent holes is provided. The novel apparatus can be used either in replacing a gas supply conduit to the electrostatic chuck without having to break vacuum in the process chamber, or can be used in clearing the vent holes when servicing an electrostatic chuck. The apparatus consists of a three-way control valve and a high pressure gas supply line of a suitable inert gas.

7 Claims, 2 Drawing Sheets

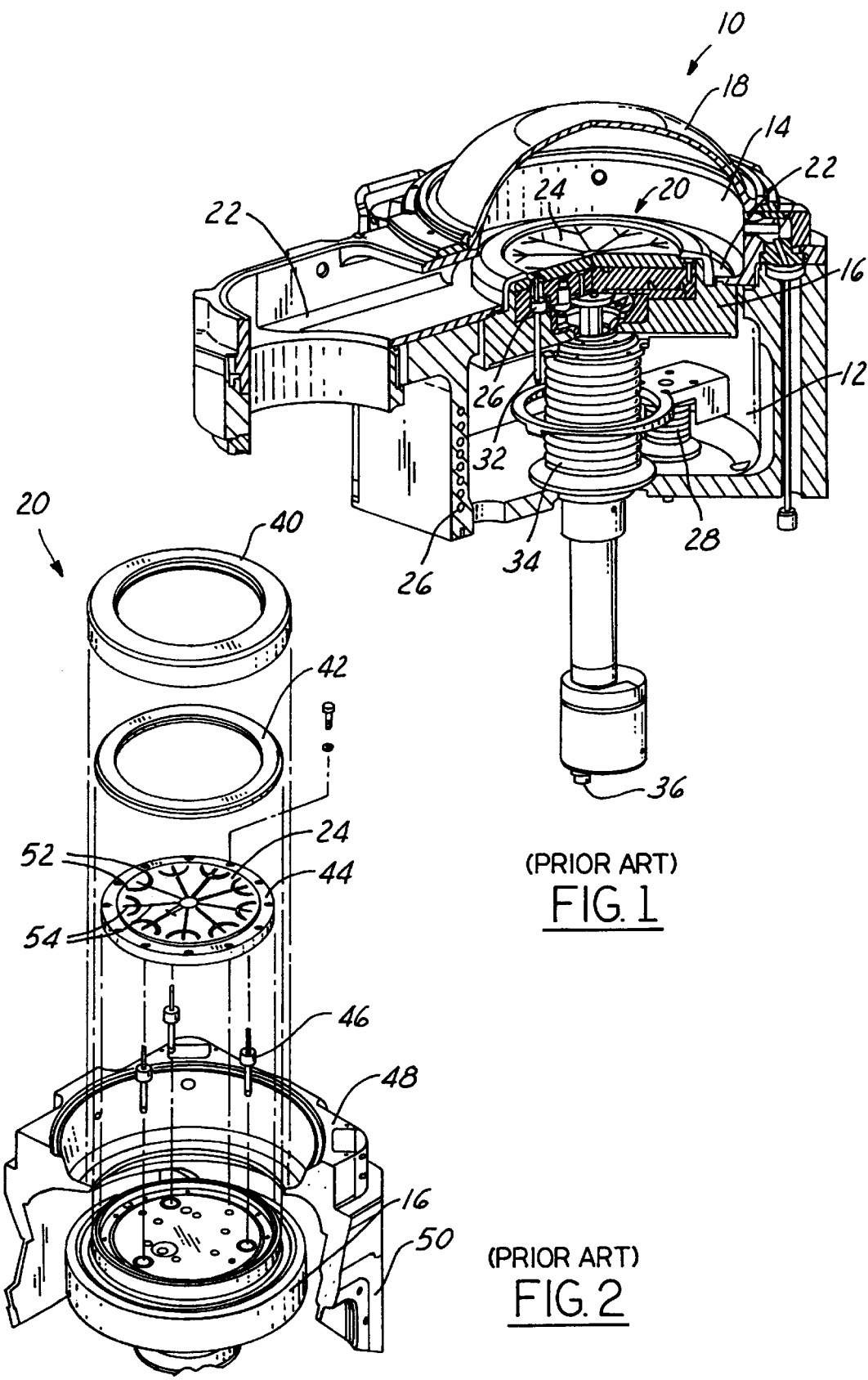
(PRIOR ART)
FIG. 1
(PRIOR ART)
FIG. 2

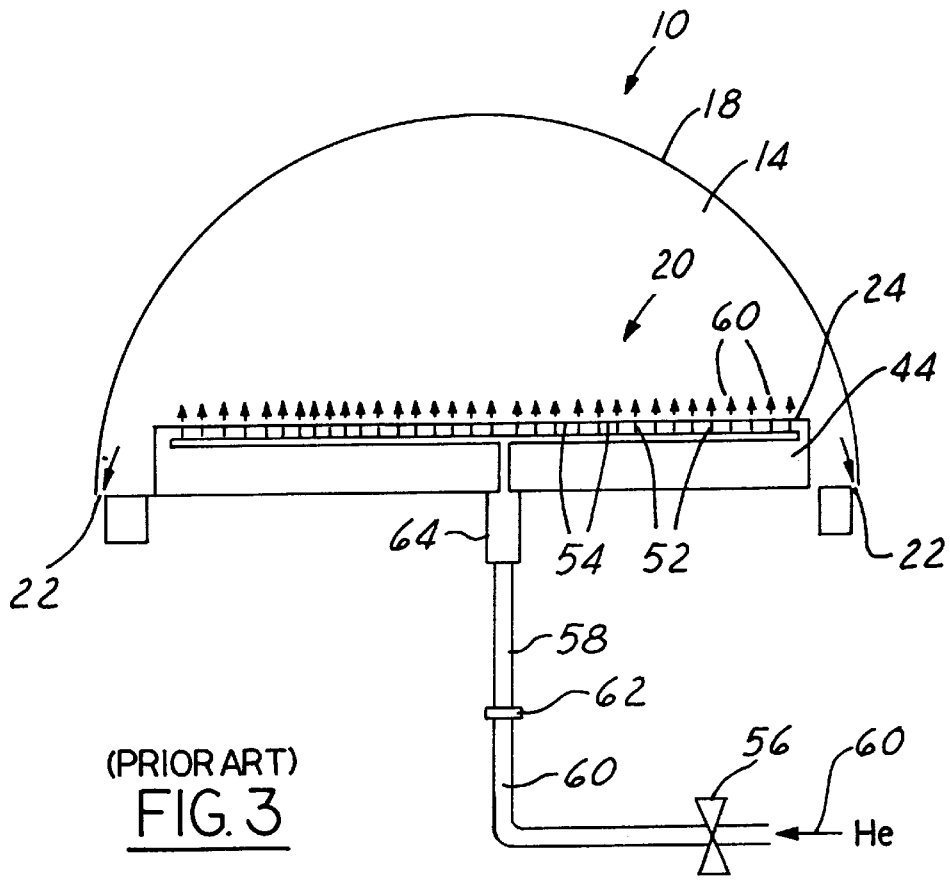
(PRIOR ART)
FIG. 3
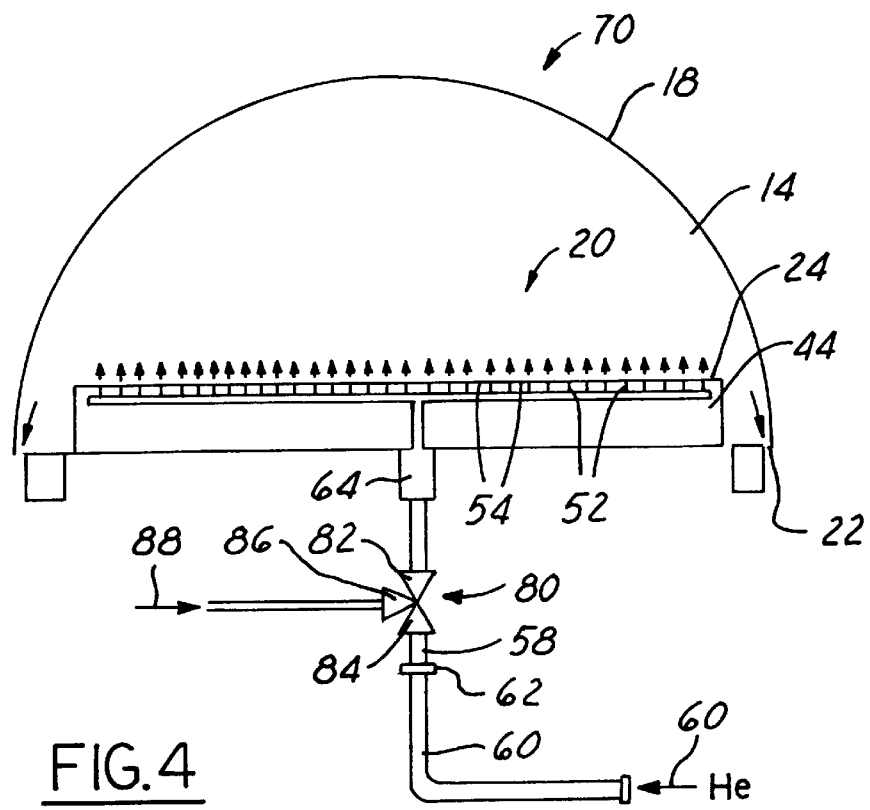
FIG. 4

APPARATUS AND METHOD FOR SERVICING A WAFER PLATFORM

FIELD OF THE INVENTION

The present invention generally relates to an apparatus used in servicing a wafer platform and a method for using such apparatus and more particularly, relates to an apparatus for servicing an electrostatic chuck for a wafer in an etch chamber such that a defective conduit to the chamber may be replaced without breaking vacuum in the chamber and vent holes in the electrostatic chuck may be cleared by an inert gas and a method for servicing such electrostatic chuck.

BACKGROUND OF THE INVENTION

Electrostatic chucking (or E-chuck) is a technique used to secure a wafer onto a susceptor in a wafer processing chamber. In recently developed wafer processing technology, the electrostatic wafer holding technique is frequently used in which a chuck electrostatically attracts and holds a wafer. The E-chuck method is a highly desirable technique for use in the vacuum handling and processing of silicon wafers. In contrast to a conventional method by mechanical means such as clamping so that only slow motion of a wafer holder is allowed during wafer transfer, an E-chuck can hold wafers with a force equivalent to several tenths of Torr pressure. Since there are no moving parts acting on the wafer surface, there can be no particle generation or contamination problems in the process chamber.

Another advantage achieved by the electrostatic chuck is the avoidance of non-uniform clamping associated with mechanical clamping device. The E-chuck utilizes an attractive Coulomb force between oppositely charged surfaces to clamp together an article and a chuck. In an electrostatic chucking operation, the force acting between the wafer and the chuck is uniform between a flat wafer and a flat chuck, in contrast to the mechanical clamping system wherein clamping is effected only around the periphery of a wafer. Special provisions must be made in a mechanical clamping system to compensate for the bowing at the center of a wafer caused by the pressure of cooling gas which is pumped in between the wafer and the pedestal that holds the wafer. The bowing phenomena is eliminated in an E-chuck since the wafer is held on a substantially planar chuck surface with an even electrostatic force distributed according to the electrode layout. The electrostatic force is generally sufficient for preventing bowing of the wafer and for promoting uniform heat transfer over the entire wafer surface by flowing an inert gas flow between the wafer and the E-chuck.

A typical vacuum process chamber 10 for etching semiconductor wafers is shown in FIG. 1. The vacuum process chamber 10 is constructed by a lower chamber 12, an upper chamber 14 and a cathode assembly 16 which is part of an electrostatic chuck assembly 20. The process chamber 10 is covered by a dome 18 which forms a hermetically sealed chamber 14. A vacuum pumping channel 22 is provided for evacuating the chamber interior such that a semiconductor process can be carried out. Internal water cooling channels 26 are also provided for cooling the apparatus during operation of the chamber. Wafer lift bellows 28 which work in conjunction with wafer lift pins 32 lift wafers from the E-chuck 20 after the completion of an etch process. Cathode lift bellows 34 are utilized for the vertical movement of the cathode 16 and the E-chuck 20. A gas inlet 36 is utilized for feeding an inert gas through the cathode lift bellows 34 to the surface 24 of the E-chuck 20.

A perspective view of the components that make up the E-chuck assembly 20 is shown in FIG. 2. In the specific construction, the E-chuck 20 consists of a focus ring 40, a capture ring 42, a shell assembly 44, lift pins 46 which are installed onto a cathode 16 inside an upper chamber 48, and a bottom chamber 50. In the operation of the E-chuck 20, a wafer (not shown) is positioned on top of the surface 24 of the shell assembly 44. In the top surface 24, a plurality of ventilation holes 52 are provided which are located at the tips of passageways 54. The plurality of pin holes, or ventilation holes 52 are provided such that a cooling gas may be fed into the gap 19. between surface 24 of the shell assembly 44 and the wafer backside.

An enlarged, cross-sectional view of the shell assembly 44 for the E-chuck 20 positioned in a process chamber 10 is shown in FIG. 3. It should be noted that the E-chuck assembly 20 is shown greatly simplified to merely illustrate the present invention and thus the construction details of the E-chuck 20 are not repeated in FIG. 3. A cooling gas 60 of helium is fed into the gas passageway 54 and then flown into a gap between the E-chuck surface 24 and the wafer backside through vent holes 52. The function of the helium gas 60 is not only to cool the backside of a wafer, but also to achieve a more uniform temperature by transferring heat to the cathode.

In the conventional process chamber 10 shown in FIG. 3, the cooling gas of helium is fed into the E-chuck 20 through a control valve 56, a first conduit 58 and a second conduit 60 which are connected by a coupling 62. The first conduit 58 is normally constructed of a flexible metal pipe such as a pipe made of braided metal tape. The second conduit 60, for ease of installation, is normally supplied in a flexible, metal mesh reinforced elastomeric hoses. After repeated usage, the flexible metal pipe 58 may develop a leak such that the ventilation function of the helium gas cannot be satisfactorily performed since the pipe moves up-and-down with the cathode all the time. In order to replace a defective conduit 58, the upper chamber 14 must be vented to the atmosphere during the procedure. This becomes a time consuming and labor consuming to process and furthermore, the venting of the upper chamber 14 to the atmosphere further increases the possibility of chamber contamination.

Another frequently observed problem in the operation of an E-chuck is the blockage, or partial blockage of the vent holes 52. When the blockage is severe, the effectiveness of a helium cooling gas for achieving temperature uniformity on the wafer is greatly reduced. The plugging of the vent holes 52 may occur after a wet cleaning process is conducted on the E-chuck 20. Any cleaning residue may be lodged in the tiny vent holes 52 to form a partial or complete blockage of the holes. A wafer processed on the E-chuck 20 may thus be burned or heated non-uniformly due to the insufficient cooling by the helium cooling gas. This may result in the scrap of the wafer.

It is therefore an object of the present invention to provide an apparatus for servicing a wafer chuck that does not have the drawbacks or shortcomings of the conventional apparatus.

It is another object of the present invention to provide an apparatus for servicing an electrostatic chuck in a semiconductor process chamber that does not require the breaking of vacuum in the chamber.

It is a further object of the present invention to provide an apparatus for servicing an electrostatic chuck in a semiconductor process chamber that is capable of isolating the process chamber when a cooling gas supply line to the chamber is disconnected.

It is another further object of the present invention to provide an apparatus for servicing an electrostatic chuck in a semiconductor process chamber that includes a three-way valve and a high pressure inert gas supply.

It is still another object of the present invention to provide an apparatus for servicing an electrostatic chuck in a semiconductor process chamber which allows the cleaning of vent holes in the surface of the electrostatic chuck by a high pressure inert gas.

It is yet another object of the present invention to provide an apparatus for servicing an electrostatic chuck in a semiconductor process chamber that can be used to replace a gas supply conduit to the chamber when a leakage in the conduit is detected to be larger than 2 m Torr per minute.

It is still another further object of the present invention to provide a method for testing leakage in a gas supply conduit to a wafer chuck by utilizing a three-way control valve and a high pressure inert gas supply.

It is yet another further object of the present invention to provide a method for venting an electrostatic chuck in an etch chamber by utilizing a three-way gas control valve and a high pressure nitrogen gas supply.

SUMMARY OF THE INVENTION

In accordance with the present invention, an apparatus for servicing an electrostatic chuck used in a semiconductor process chamber and a method for utilizing such apparatus are provided.

In a preferred embodiment, an apparatus for servicing a wafer chuck is provided which includes a wafer chuck situated in a chamber, the chuck has a top surface equipped with a multiplicity of apertures, the multiplicity of apertures are in fluid communication with an internal passageway provided in the chuck, a first conduit in fluid communication with the internal passageway at one end and with a first valve opening of a three-way valve at an opposite end, a second conduit in fluid communication with a first inert gas supply at one end and with a second valve opening of a three-way valve at an opposite end, and a three-way valve which has a first valve opening connected to the first conduit, a second valve opening connected to the second conduit and a third valve opening connected to a second inert gas supply, wherein a fluid communication between the first valve opening and the third valve opening enables the second conduit to be replaced without breaking vacuum in the chamber, and a fluid communication between the first valve opening and the second valve opening enables the multiplicity of apertures to be ventilated.

The wafer chuck serviced by the apparatus may be an electrostatic chuck. The multiplicity of apertures are adapted for circulating an inert gas on the bottom surface of a wafer positioned on the chuck. The internal passageway is adapted for providing fluid communication with the multiplicity of apertures at one end and for receiving a first conduit at an opposite end. The second conduit is fabricated of a reinforced braided elastomeric material. The second conduit provides fluid communication with a first inert gas supply of helium for purging a bottom side of a wafer situated on the electrostatic chuck. The second inert gas supply may be nitrogen.

The present invention is further directed to a method for testing leakage in a gas supply conduit to a wafer chuck including the steps of first providing a wafer chuck in a vacuum chamber, the wafer chuck has a top surface that is equipped with a plurality of apertures in fluid communication with a passageway in the chuck, then connecting a first conduit to the passageway at one end and to a first valve opening in a three-way valve at an opposite end, then connecting a second conduit to a second valve opening of the three-way valve at one end and to a first gas supply source at an opposite end, then evacuating the vacuum chamber to a pressure with the first valve opened to the second valve and monitoring changes in the pressure, and connecting the first valve to a third valve opening in the three-way valve when the third valve opening is connected to a second gas supply source and when a leak is detected in the second conduit such that the second conduit may be replaced without breaking vacuum in the vacuum chamber.

The method may further include the step of closing a passageway between the first valve opening and the second valve opening prior to opening a passageway between the first valve opening and the third valve opening. The vacuum chamber may be an etcher. The wafer chuck may be an electrostatic chuck. The first gas supply source and the second gas supply source are at least one gas selected from the group of nitrogen, helium and argon. The method may further include the step of evacuating the vacuum chamber to a pressure of not higher than 10 m Torr. The method may further include the step of determining a leak status in the vacuum chamber when the pressure increases more than 2 m Torr in one minute.

The present invention is further directed to a method for venting an electrostatic chuck in an etch chamber which can be carried out by the operating steps of first providing an electrostatic chuck in an etch chamber, the electrostatic chuck has a top surface that is equipped with a plurality of vent holes in fluid communication with a passageway in the chuck, then connecting a first conduit to the passageway at one end and to a first valve opening in a three-way valve at an opposite end, then connecting a second conduit to a second valve opening of the three-way valve at one end and to a first gas supply source at an opposite end, then connecting the first valve opening to a third opening in the three-way valve when the third valve opening is connected to a venting gas supply source, and flowing the venting gas through the vent holes such that all residual in the vent holes are blown out.

The method may further include the step of closing a passageway between the first valve opening and the second valve opening by the operation of the three-way valve before connecting the first valve opening to the third valve opening. The method may further include the step of selecting the first gas supply source and the venting gas supply source from the group of gases consisting of nitrogen, argon and helium. The first gas supply source used may be helium and the venting gas supply source used may be nitrogen.

BRIEF DESCRIPTION OF THE DRAWINGS

These and other objects, features and advantages of the present invention will become apparent from the following detailed description and the appended drawings in which:

FIG. 1 is a perspective view of a conventional semiconductor process chamber equipped with an electrostatic chuck.

FIG. 2 is a perspective view of the components for the electrostatic chuck of Figure.

FIG. 3 is a simplified, cross-sectional view of the vacuum process chamber of FIG. 1 showing an electrostatic chuck and a venting conduit installed therein.

FIG. 4 is a simplified, cross-sectional view of a present invention apparatus for servicing an electrostatic chuck situated in a semiconductor process chamber.

DETAILED DESCRIPTION OF THE PREFERRED EMBODIMENT

The present invention discloses an apparatus for servicing a wafer chuck that is situated in a semiconductor process chamber and a method for using such apparatus.

The apparatus may consist of a three-way control valve and a separate inert gas supply system such that when a vent gas supply conduit to the electrostatic chuck is found defective, the conduit may be replaced without breaking vacuum in the process chamber. This greatly improves the maintenance efficiency by saving the time required to re-evaluate the chamber and by eliminating possibility of chamber contamination when the chamber would otherwise be required to be ventilated to the atmosphere.

The present invention novel apparatus and method enables one to test and replace a gas supply conduit without disassembling the electrostatic chuck. Vent holes provided in the surface of the electrostatic chuck are frequently plugged after a wet cleaning process for the E-chuck is carried out. The present invention novel method greatly reduces wafer scrap and shortens the time required for a maintenance procedure. The wafer scrap caused by partially burned wafers due to blocked vent holes can be eliminated. The throughput of the process can be increased and the cost of the fabrication process can be reduced.

As shown in FIG. 4, a present invention vacuum process chamber 70 is shown. In the vacuum process chamber 70 which is likely an etch chamber, an electrostatic chuck 20 is installed. The electrostatic chuck 20 is equipped with an electrode body 44 which has a top surface 24 equipped with a multiplicity of apertures 52. The multiplicity of apertures 52 are connected by a passageway 54 to a conduit 58 and then to a first valve opening 82 of a three-way control valve 80. A second valve opening 84 of the three-way control valve 80 is connected to a second conduit 60 through a coupling 62. The second conduit 60 is connected at the other end to an inert gas supply 60. A frequently used inert gas for purging the backside of a wafer may be helium.

The present invention novel apparatus for servicing the electrostatic chuck 20 is the three-way control valve 80 and a separate inert gas supply 88. A third valve opening 86 of the three-way control valve 80 is connected to the separate inert gas supply 88. The inert gas supply is preferably a high pressure nitrogen gas such that it can be used effectively to purge the vent holes 52 after a wet cleaning process, or after the electrostatic chuck 20 has been used in many process cycles.

The present invention novel apparatus allows not only the replacement of the conduit 58, when a leakage is detected, but also allows the use of a high pressure nitrogen gas for purging through the vent holes 52 provided in the surface of the electrode 44. The method for utilizing the present invention novel apparatus can be described as follows.

The method for testing leakage in a gas supply conduit 60 to an electrostatic chuck 20 can be carried out by first providing an electrostatic chuck 20 positioned in a vacuum process chamber 70, such as an etch chamber. The wafer chuck 20 has a top surface 24 that is equipped with a plurality of apertures 52 that are in fluid communication with a passageway 54 in the chuck. A first conduit 58 is then connected to a gas filter 64 that connects the passageway 54 at one end and to a first valve opening 82 in the three-way control valve 80 at an opposite end. A second conduit 60 is then connected to a second valve opening 84 of the three-way control valve 80 at one end and to a first gas supply source 60 at an opposite end. The first gas supply source may be suitably a helium gas source, however, any other suitable inert gas may also be used. The vacuum chamber 70 is then evacuated such that the upper chamber cavity 14 achieves a low pressure of not higher than 10 m Torr, suitable for an etching process. With the first valve 82 opened to the second valve 84, the changes in the pressure of the vacuum chamber 14 is monitored. The first valve is then connected to a third valve opening 86 in the three-way control valve 80 when the third valve opening is connected to a second gas supply source 88, preferably a high pressure nitrogen source, when a leak is detected in the second conduit 60 such that the second conduit may be replaced without breaking vacuum in the vacuum chamber 14.

In an etching process, when the chamber pressure is reduced to less than 10 m Torr, an increase in the chamber pressure by more than 2 m Torr per minute would be considered unacceptable and an indication of a leakage in the conduit 60. Prior to opening the passageway between the first valve opening and the third valve opening, the passageway between the first valve opening and the second valve opening is first closed. The first and the second gas supply source may be suitably selected from nitrogen, helium and argon.

The present invention apparatus may further be utilized for venting an electrostatic chuck positioned in a semiconductor process chamber, i.e., an etch chamber by the following procedure. First, an electrostatic chuck 20 is provided in a semiconductor process chamber 70 such as an etch chamber. The electrostatic chuck 20 has a top surface 24 that is equipped with a plurality of vent holes 52 which are in fluid communication with a passageway 54 in the chuck. A first conduit 58 is then connected to the passageway 54 at an upper end and to a first valve opening 82 in a three-way control valve 80 at a lower end. A second conduit 60 is then connected to a second valve opening 84 of the three-way control valve 80 at an upper end and to a first gas supply source 60 at an lower end. The first valve opening 82 is then connected to a third valve opening 86 in the three-way control valve 80 when the third valve opening is connected to a high pressure venting gas supply source 88. A venting gas 88 is then flown through the vent holes 52 such that all residue in the vent holes 52 are blown out. Prior to the connection being made between the first valve opening and the third valve opening, a passageway between the first valve opening and the second valve opening is first closed.

The present invention novel apparatus and method for either replacing a defective conduit or venting the vent apertures when servicing an electrostatic chuck have therefore been amply demonstrated in the above descriptions and in the appended drawing of FIG. 4. It should be noted that while an application in an etch chamber and an electrostatic chuck is specifically illustrated here, the present invention novel apparatus can be utilized on any wafer holding devices as long as a cooling gas is required for the backside of a wafer and the ventilation of vent holes in the wafer holder is desired.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. An apparatus for servicing a wafer chuck comprising:

a wafer chuck situated in a chamber, said chuck having a top surface equipped with a multiplicity of apertures, said multiplicity of apertures being in fluid communication with an internal passageway provided in said chuck, a first conduit in fluid communication with said internal passageway at one end and with a first valve opening of a three-way valve at an opposite end, a second conduit in fluid communication with a first inert gas supply at one end and with a second valve opening of a three-way valve at an opposite end, a three-way valve having a first valve opening connected to said first conduit, a second valve opening connected to said second conduit and a third valve opening connected to a second inert gas supply, whereby a fluid communication between said first valve opening and said third valve opening enables said second conduit to be replaced without breaking vacuum in said chamber; and a fluid communication between said first valve opening and said second valve opening enables said multiplicity of apertures to be ventilated.

2. An apparatus for servicing a wafer chuck according to claim 1, wherein said wafer chuck is an electrostatic chuck.

3. An apparatus for servicing a wafer chuck according to claim 1, wherein said multiplicity of apertures being adapted for circulating an inert gas on the bottom surface of a wafer positioned on said chuck.

4. An apparatus for servicing a wafer chuck according to claim 1, wherein said internal passageway being adapted for providing fluid communication with said multiplicity of apertures at one end and for receiving a first conduit at an opposite end.

5. An apparatus for servicing a wafer chuck according to claim 1, wherein said second conduit being fabricated of a reinforced braided elastomeric material.

6. An apparatus for servicing a wafer chuck according to claim 1, wherein said first inert gas supply is a supply of helium and is used for purging a bottom side of a wafer situated on said chuck.

7. An apparatus for servicing a wafer chuck according to claim 1, wherein said second inert gas supply is a supply of nitrogen.

* * * * *